United States Patent
Rojahn et al.

(10) Patent No.: US 10,687,443 B2
(45) Date of Patent: Jun. 16, 2020

(54) CONTROL UNIT (71) Applicant: Robert Bosch GmbH, Stuttgart (DE)

(72) Inventors: Martin Rojahn, Tuebingen (DE);
Matthias Ludwig, Moessingen (DE);
Michael Hortig, Eningen U.A. (DE);
Thomas Schrimpf, Reutlingen (DE);
Wolfgang Woernle, Neustetten (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/564,622

(22) PCT Filed: Mar. 23, 2016

(86) PCT No.: PCT/EP2016/056395
§ 371 (c)(1),
(2) Date: Oct. 5, 2017

(87) PCT Pub. No.: WO2016/162213
PCT Pub. Date: Oct. 13, 2016

(65) Prior Publication Data
US 2018/0092255 A1 Mar. 29, 2018

(30) Foreign Application Priority Data

Apr. 10, 2015 (DE) .................. 10 2015 206 480

(51) Int. Cl.
*H05K 5/00* (2006.01)
*H05K 1/02* (2006.01)
(Continued)

(52) U.S. Cl.
CPC .......... *H05K 7/20854* (2013.01); *G01S 19/35* (2013.01); *H05K 1/0203* (2013.01);
(Continued)

(58) Field of Classification Search
CPC ....... H05K 1/0203; H05K 2201/10106; H05K 1/181; H05K 7/20409; H05K 1/189;
(Continued)

(56) References Cited

U.S. PATENT DOCUMENTS 5,631,416 A * 5/1997 Rilling .................... G01F 1/684
73/204.22
6,049,469 A * 4/2000 Hood ...................... G06F 1/182
174/388

(Continued)

FOREIGN PATENT DOCUMENTS

DE 3916899 11/1990
DE 19921692 5/2000
(Continued)

OTHER PUBLICATIONS

International Search Report for Application No. PCT/EP2016/056395 dated Jun. 29, 2016 (English Translation, 3 pages).

*Primary Examiner* — Adam B Dravininkas
(74) *Attorney, Agent, or Firm* — Michael Best & Friedrich LLP (57) ABSTRACT The invention relates to a control unit (10; 10a to 10d), particularly for vehicle navigation, having a housing (13) that consists of at least two housing elements (11, 12; 61, 65, 72; 75), having at least one circuit carrier (16; 16a; 64; 81) on which at least one heat-generating component (1) is arranged, having a thermal transfer element (30; 61), made of metal, for dissipating the heat generated by the at least one heat-generating component (1), having at least one sensor element (40, 41) that is connected at least indirectly to the at least one circuit carrier (16; 16a; 64; 81), having at least one plug connection body (35), made of plastic, having connection elements (36) for making electrical contact with the at least one circuit carrier (16; 16a; 64; 81), wherein the plug connection body (35) is formed in the region of a
(Continued)

frame-like or cover-like housing element (12; 65;75), made of plastic, so as to be integral therewith or as a component that is separate from the housing element (12; 65; 75).

21 Claims, 8 Drawing Sheets (51) Int. Cl.
*H05K 7/20* (2006.01)
*G01S 19/35* (2010.01)
*H05K 1/18* (2006.01)
*H05K 5/02* (2006.01)
*H05K 5/03* (2006.01)

(52) U.S. Cl.
CPC ........... *H05K 1/0243* (2013.01); *H05K 1/181* (2013.01); *H05K 5/006* (2013.01); *H05K 5/0013* (2013.01); *H05K 5/0017* (2013.01); *H05K 5/0043* (2013.01); *H05K 5/0052* (2013.01); *H05K 5/0056* (2013.01); *H05K 5/0247* (2013.01); *H05K 5/03* (2013.01); *H05K 2201/10151* (2013.01)

(58) Field of Classification Search
CPC .. H05K 7/20436; H05K 1/141; H05K 7/2039; H05K 7/20418; H05K 1/0209; H05K 1/0215; H05K 13/00; H05K 5/0217; H05K 7/209; H05K 2201/09081; H05K 2201/10446; H05K 2201/10386; H05K 9/0007; H05K 9/0047; H05K 7/2049; H05K 9/0079; H05K 9/0081; H05K 3/0061; H05K 7/20154; H05K 5/03; H05K 7/1427

See application file for complete search history.

(56) References Cited

U.S. PATENT DOCUMENTS

| | | | | |
|---|---|---|---|---|
| 6,778,388 B1* | 8/2004 | Minelli | .................. | H05K 5/061 |
| | | | | 165/185 |
| 7,050,305 B2* | 5/2006 | Thorum | ............... | H05K 5/0013 |
| | | | | 165/185 |
| 2004/0160754 A1* | 8/2004 | Kobayashi | ........... | H05K 1/0203 |
| | | | | 361/783 |
| 2006/0089019 A1* | 4/2006 | Mitani | ............... | G01C 19/5628 |
| | | | | 439/76.2 |
| 2009/0052142 A1* | 2/2009 | Brewer | .................. | H05K 1/144 |
| | | | | 361/721 |
| 2011/0228486 A1* | 9/2011 | Lanni | ..................... | H05K 7/209 |
| | | | | 361/722 |
| 2012/0300405 A1* | 11/2012 | Weeber | ................. | H01L 23/552 |
| | | | | 361/709 |
| 2014/0140010 A1* | 5/2014 | Chan | ...................... | H05K 7/209 |
| | | | | 361/714 |
| 2014/0321064 A1* | 10/2014 | Bose | ................... | H01L 23/4093 |
| | | | | 361/720 |
| 2015/0230363 A1* | 8/2015 | Dernier | ................. | H05K 1/021 |
| | | | | 174/548 |
| 2015/0289357 A1* | 10/2015 | Wakana | ................ | H05K 5/006 |
| | | | | 174/535 |
| 2016/0205762 A1* | 7/2016 | Ritter | ................ | H05K 7/20409 |
| | | | | 361/720 |
| 2017/0006711 A1* | 1/2017 | Liskow | ................ | H05K 3/3421 |

FOREIGN PATENT DOCUMENTS

| | | |
|---|---|---|
| DE | 102006029977 | 1/2008 |
| EP | 1677583 | 7/2006 |
| JP | 2009008048 A | 4/2009 |
| JP | 2015050175 A | 3/2015 |

* cited by examiner

CONTROL UNIT

BACKGROUND OF THE INVENTION

The invention relates to a control unit such as is used in particular as a constituent part of a navigation system or for automated driving in motor vehicles. A control unit of said type is designed to process both information fed as input signals to the control unit via an HF (high-frequency) antenna cable and information from sensors arranged in particular within the control unit, in order to determine the exact position of the control unit or of the vehicle. Here, use is made of the knowledge that exact navigation is possible only on the basis of the combination of satellite-based information and information from internal sensors. An electrical and/or electronic circuit arranged within a control unit of said type is distinguished by the fact that it has at least one heat-generating component which is arranged on a circuit carrier, in particular in the form of a circuit board. Furthermore, the at least one sensor element is arranged on the same circuit carrier or circuit board or else on a different circuit carrier or circuit board. In order that, in particular, the functionality of the at least one sensor element is influenced as little as possible, it is essential that the heat of the heat-generating component is conducted out of the control unit in as effective a manner as possible. For this purpose, in practice, use is made of a heat-conducting element composed of metal. Furthermore, the electrical contacting of a control unit of said type is realized by means of a plug connector body which bears connector elements which serve for the electrical contacting of the at least one circuit carrier. For large-scale production situations in particular, the control units known from the prior art are not of optimal design from a manufacturing aspect or with regard to the lowest possible production costs. Furthermore, the demands on such control units are particularly high if they are utilized for automated driving, in the case of which driving of the vehicle is performed without driver intervention. Here, reliable functioning and thus, for example, a reliable dissipation of heat from heat-generating components is particularly important.

SUMMARY OF THE INVENTION

Taking the presented prior art as a starting point, it is the object of the invention to optimize a control unit, which is designed both to process (high-frequency) signals and also accommodate at least one sensor element, from a production aspect and with regard to the lowest possible production costs.

In a first design embodiment, which makes it possible to realize a particularly low weight of the housing of the control unit, it is proposed that the heat-conducting element is arranged as an insert part in a housing element composed substantially of plastic, that the housing element has a connecting region for the connection of the housing element to a carrier element, and that the heat-conducting element is thermally connected to the connecting region. In other words, this means that the heat conduction takes place via the heat-conducting element into the region of a fastening point to a carrier element, wherein, as a result of the coupling of the heat-conducting element to the connecting region, an optimum transmission of the heat from the control unit to the carrier element is realized. Normally, a body-side carrier element of said type is composed at least regionally of metal, and therefore permits a fast and effective dissipation of the heat from the control unit.

In order to firstly permit the object of as effective as possible a dissipation of heat and secondly ensure and/or improve the functionality of the at least one sensor element, in particular with regard to vibrations acting on the sensor element, it is proposed that the at least one heat-generating component and the at least one sensor element are arranged on different circuit carriers, wherein the circuit carrier for the at least one sensor element is arranged in vibration-damped fashion. Such a design embodiment has the advantage in particular that the heat transfer from the at least one heat-generating component can take place via a relatively rigid connection between the circuit carrier which bears the at least one heat-generating component and the heat-conducting element, whereas, on the other hand, the at least one sensor element can, by means of the second circuit carrier, be arranged in vibration-damped fashion within the control unit.

To optimize the vibration decoupling of the at least one sensor element, it is provided, in a refinement of the latter proposal, that the circuit carrier which bears the at least one sensor element is electrically connected, preferably by means of a mechanically floating connection, exclusively to the circuit carrier which bears the at least one heat-generating component. It is thus preferably the case that no electrical contacting of the circuit carrier which bears the at least one sensor element is realized via electrical connector elements or connector pins arranged in particular on the housing, which otherwise promote a transmission of vibrations from the housing to the circuit carrier which bears the at least one sensor.

As an alternative to this, however, for the purposes of realizing improved thermal decoupling between the two circuit carriers, it is also possible for the circuit carrier which bears the at least one sensor element to be mechanically connected to the circuit carrier which bears the at least one heat-generating component by means of connecting elements arranged in a housing element.

A particularly good dissipation of heat is realized if the heat-conducting element is formed by a housing element composed of metal, in particular in the form of a housing base. In this way, even without thermal coupling to a carrier element, the heat-conducting element has a relatively large heat storage capacity and radiation surface area, such that particularly fast and effective cooling of the heat-generating component is made possible.

In a refinement of the latter proposal which is preferred from a manufacturing aspect, it is provided that the housing base which forms the housing element is formed as a deep-drawn part, preferably composed of sheet metal, and that the housing base has, in the region of overlap with the at least one heat-generating component, an elevation or inwardly formed portion which is thermally coupled to the circuit carrier for the at least one heat-generating component or to the heat-generating component. Such thermal coupling of the circuit carrier or of the component is in this case commonly realized in the form of a heat-conducting adhesive.

From a manufacturing aspect, it is particularly advantageous, if a frame-like housing element is provided, for the latter to be closed off by a lid composed of plastic. In this way, in particular, the required housing volume in the case of two circuit carriers being used is reduced as a result of an advantageous manufacturing step sequence.

Furthermore, with regard to manufacturing and costs, it is particularly advantageous if the points of contacting between the electrical connector elements and the at least one circuit carrier are formed by means of press-fit connections.

BRIEF DESCRIPTION OF THE DRAWINGS

Further advantages, features and details of the invention will emerge from the following description of preferred exemplary embodiments and from the drawing.

In the drawing.

Identical elements or elements of identical function are denoted by the same reference designations in the figures.

DETAILED DESCRIPTION

Figure 1:
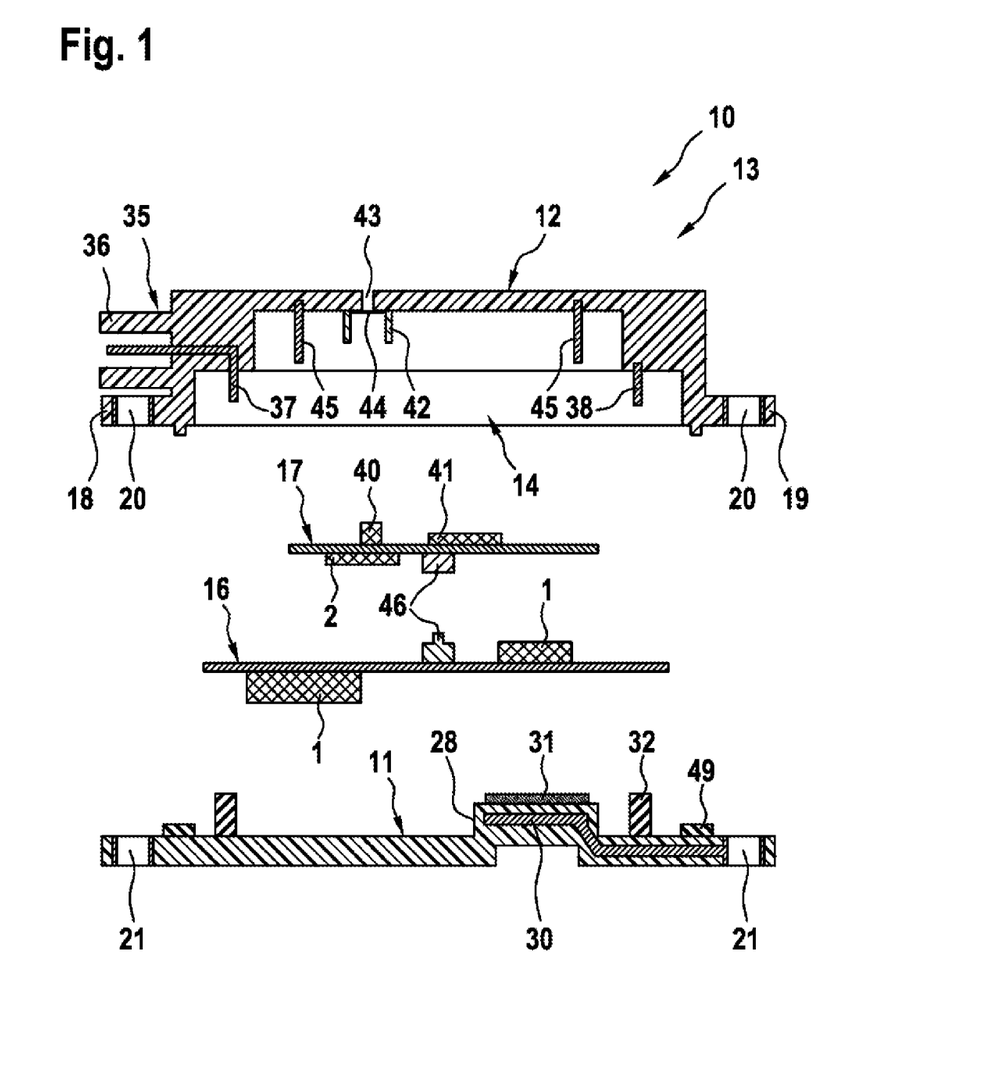
FIG. 1 shows the components of a first control unit in a simplified longitudinal section.
Figure 2:
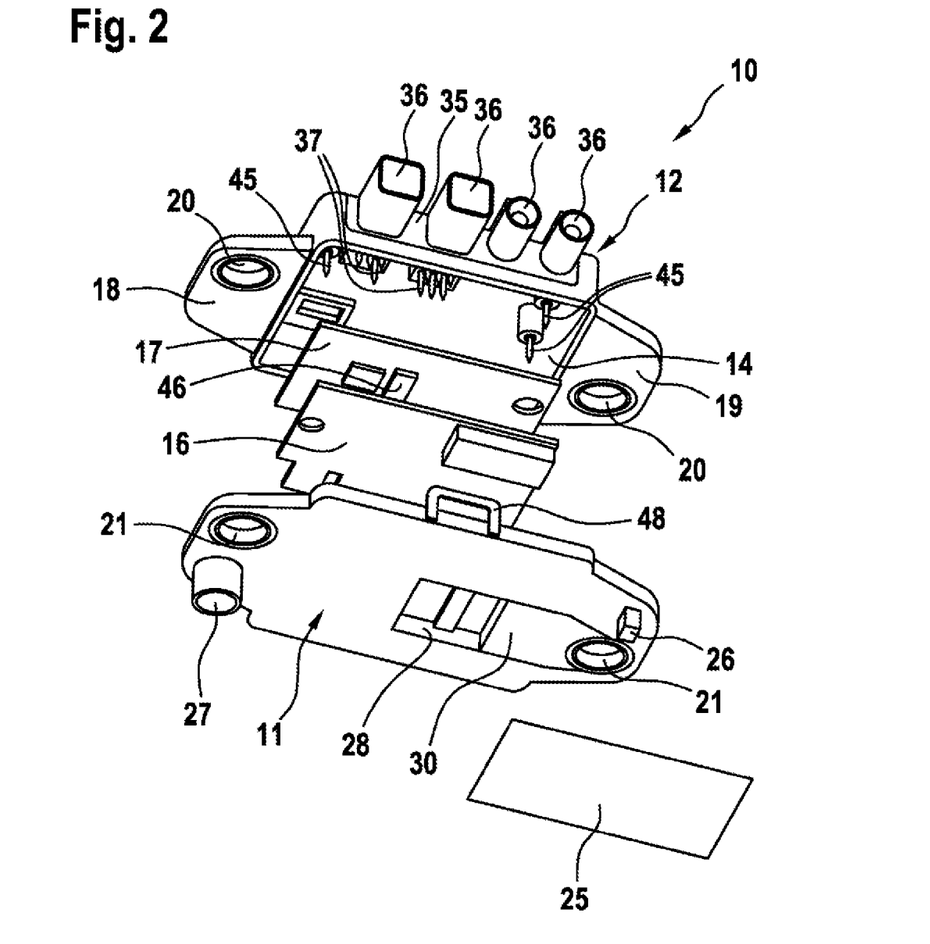
FIG. 2 shows the components of the control unit of FIG. 1 in a partially assembled state in a perspective view from below.

FIGS. 1 and 2 illustrate the components of a first control unit 10. The control unit 10 is used in particular as a constituent part of a navigation system or of a system for determining the location of the control unit 10 in a motor vehicle (not illustrated). Here, the control unit 10 processes both signals which are fed to the control unit 10 as input variables via a (high-frequency) antenna cable (not illustrated) and signals from sensors arranged within the control unit 10, for example pressure sensors, yaw rate sensors, magnetic field sensors or the like.

The first control unit 10 has a housing 13 composed of two housing elements 11, 12. The housing element 11 forms a housing base, whereas the housing element 12 is formed in the manner of a lid or cover and, when connected to the housing element 11, forms an interior space 14 for accommodating two separate circuit carriers 16, 17, which are for example in the form of circuit boards. The housing element 12 has two fastening sections 18, 19 which project in the manner of flanges and which have passage openings 20 formed therein. The passage openings 20 are, in the assembled state of the two housing elements 11, 12, arranged so as to overlap passage openings 21 on the housing element 11. By means of fastening elements which are not illustrated, in particular by means of fastening screws, the housing 13 can be fastened to a carrier element 25 which is illustrated merely symbolically and in a subregion, for example to a metallic body part.

For the correct positioning of the housing 13 with respect to the carrier element 25, the housing element 11 may have, on the underside averted from the housing element 12, two pin-like positioning elements 26, 27 which have different cross sections (FIG. 2) and which interact with corresponding openings on the carrier element 25 (not illustrated).

The housing element 11 is composed of plastic and is preferably formed as an injection-molded part. Said housing element has an elevation 28, in the region of which the housing element 11 projects further into the interior space 14 than in the other regions of the housing element 11. It can also be seen that a heat-conducting element 30 composed of metal is arranged in the material of the housing element 11, which heat-conducting element is at least regionally insert-molded in the material of the housing element 11, and which heat-conducting element projects into the region of at least one passage opening 21 of the housing element 11. In FIG. 2, in order to be more clearly recognizable, the heat-conducting element 30 is illustrated in partially cut-away form. In particular, from the illustration of FIG. 1, it can furthermore be seen that the heat-conducting element 30 terminates flush with the top side and bottom side of the housing element 11 in the region of the passage opening 21. In this way, when the housing 13 is fastened by means of fastening screws, which are commonly composed of metal, as fastening elements, a heat flow or dissipation of heat via the heat-conducting element 30 in the direction of the carrier element 25 is made possible.

The heat-conducting element 30 interacts, via a heat-conducting adhesive 31, with the underside of the first circuit carrier 16. Electrical and/or electronic components 1 are arranged on the first circuit carrier 16, wherein at least one of the components 1 is a heat-generating component 1, the heat of which can be dissipated from the interior space 14 of the housing 13 during operation via the heat-conducting element 30. For this purpose, it is provided that the elevation 28 is arranged in that region of the first circuit carrier 16 in the region of which the heat-generating component 1 is also situated. In the installed state on the housing element 11, the first circuit carrier 16 lies on a preferably encircling, preferably elastic elevation 32, composed for example of silicone, which projects from the housing element 11 in the direction of the first circuit carrier 16.

On the second housing element 12, which is likewise composed of plastic and which is in the form of an injection-molded part, there is provided a plug connector body 35. The plug connector body 35 is formed by insert molding of electrical connector elements 36 with plastics material, wherein the connector elements 36 may be designed on a customer-specific or application-specific basis. In particular, at least one of the connector elements 36 is formed as a high-frequency connector, for example in the form of a high-frequency socket, via which a high-frequency signal can be fed as an input variable to at least one of the circuit carriers 16, 17. The plug connector body 35 may, as illustrated, be formed as a component separate from the housing element 12 or else may be formed as an integral constituent part of the housing element 12. If the plug connector body 35 is an element which is separate from the housing element 12, the connection to the housing element 12 may be realized by insert molding of the plug connector body 35 with the material of the housing element 12 or else in some other way, for example by means of a (sealed-off) adhesive connection.

The connector elements 36 are designed for the contacting of the first circuit carrier 16. For this purpose, they have connector regions 37 which project in the direction of the first circuit carrier 16 and which are designed to interact with corresponding openings in the first circuit carrier 16 in order to form a press-fit connection. On the side situated opposite the connector element 36, a further connecting element 38 (FIG. 1) is shown in the housing element 12, which further connecting element likewise engages into a corresponding opening, formed in the first circuit carrier 16, so as to form an interference fit or press-fit connection and which serves for further stabilizing and/or fixing the first circuit carrier 16 in the housing element 11 in the assembled state.

The second circuit carrier 17, which is likewise in the form of a circuit board, is situated parallel and, in relation to the housing element 11, on that side of the first circuit carrier 16 which is averted from the housing element 11. The second circuit carrier 17 has, in addition to the further electrical and/or electronic components 2, which preferably generate at least substantially no heat, at least one sensor element 40, 41, which in the illustrated exemplary embodiment are arranged on that side of the second circuit carrier 17 which is averted from the first circuit carrier 16. One sensor element 40 is, by way of example, formed as a pressure sensor, and in the installed state is surrounded or enclosed in a circumferential direction by a housing wall 42 of the housing element 12. For the transmission of the outside pressure to the sensor element 40, the housing element 12 is equipped, in the region of overlap with the sensor element 40, with an opening 43, in the region of which there is arranged a pressure diaphragm 44 which permits a transmission of the outside pressure to the sensor element 40. The second circuit carrier 17 is (mechanically) connected to the housing 13 substantially only via the housing element 12. For this purpose, the housing element 12 has fastening elements 45 which project in the direction of the second circuit carrier 17 and which interact with corresponding openings in the second circuit carrier 17. It is essential here that the fastening elements 45 are formed at least indirectly as vibration-damping fastening elements 45. For this purpose, it may for example be provided that the fastening elements 45 are composed of a soft and/or elastic material, such that vibrations transmitted via the housing element 12 and/or housing 13 are transmitted in damped fashion to the circuit carrier 17 which bears the at least one sensor element 40, 41. It is alternatively also conceivable, for example, for the fastening elements 45 to be of rigid form, but for the corresponding fastening openings on the second circuit carrier 17, which interact with the fastening elements 45, to have vibration-damping characteristics, for example in the form of an elastic coating or an elastic element.

The two circuit carriers 16, 17 are connected to one another by means of an electrical plug connection 46 which permits an electrical connection between the components 2 or the sensor elements 40, 41 of the circuit carrier 17 and the components 1 of the circuit carrier 16. Here, it is essential that the plug connection 46 is in the form of a mechanically floating plug connection 46, that is to say at least substantially no vibrations are transmitted from the circuit carrier 16 to the circuit carrier 17 by the plug connection 46.

In the exemplary embodiment illustrated, the two housing elements 11, 12 of the housing 13 are connected to one another by means of a detent or clip connection 48. To ensure the sealing action between the two housing elements 11, 12, it is for example the case that the housing element 11 has an encircling seal 49 which, in the exemplary embodiment, interacts with a projection or the like which is formed so as to overlap the seal 49 on the housing element 12. A screw connection between the two housing elements 11, 12 is self-evidently alternatively also possible (not illustrated).

It self-evidently also falls within the scope of the invention for the two housing elements 11, 12 of the housing 13 to be connected to one another by means of some other connecting technique, for example by means of an adhesive connection, a (laser-)welded connection or the like. It is essential merely that the two housing elements 11, 12 are sealingly connected to one another.

Figure 3:
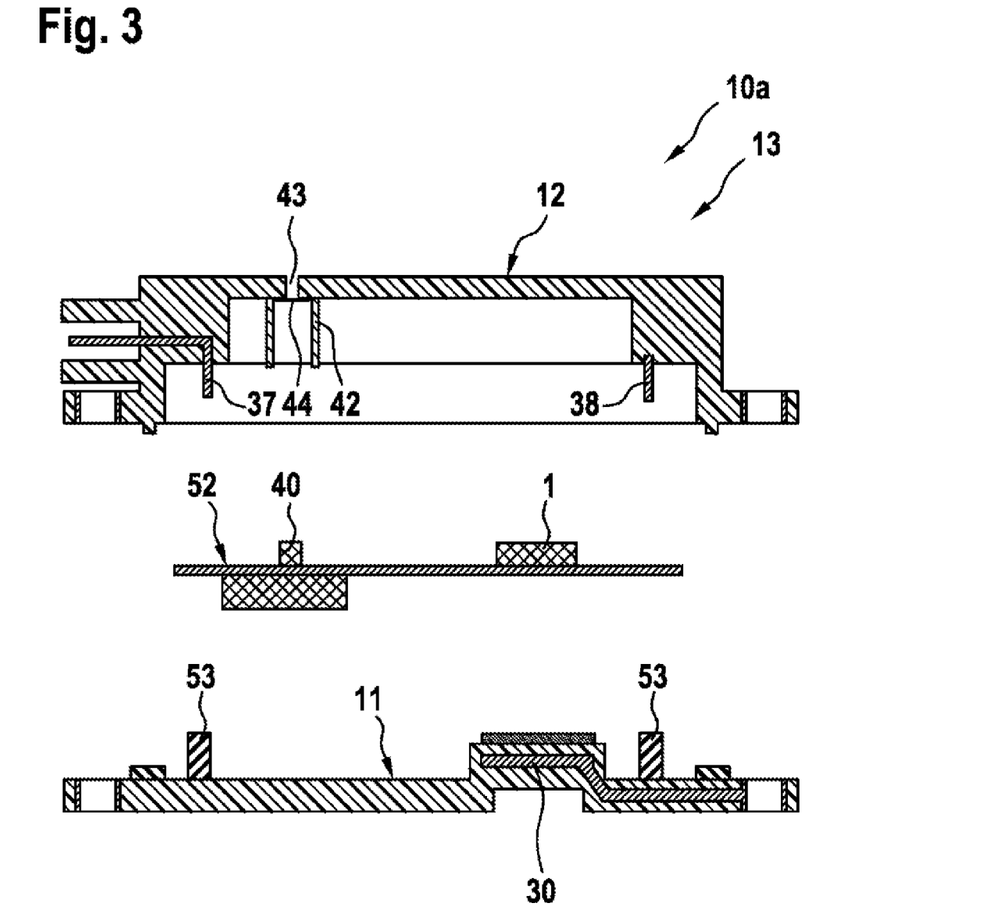
FIG. 3 shows the components of a second control unit in a simplified longitudinal section.
Figure 4:
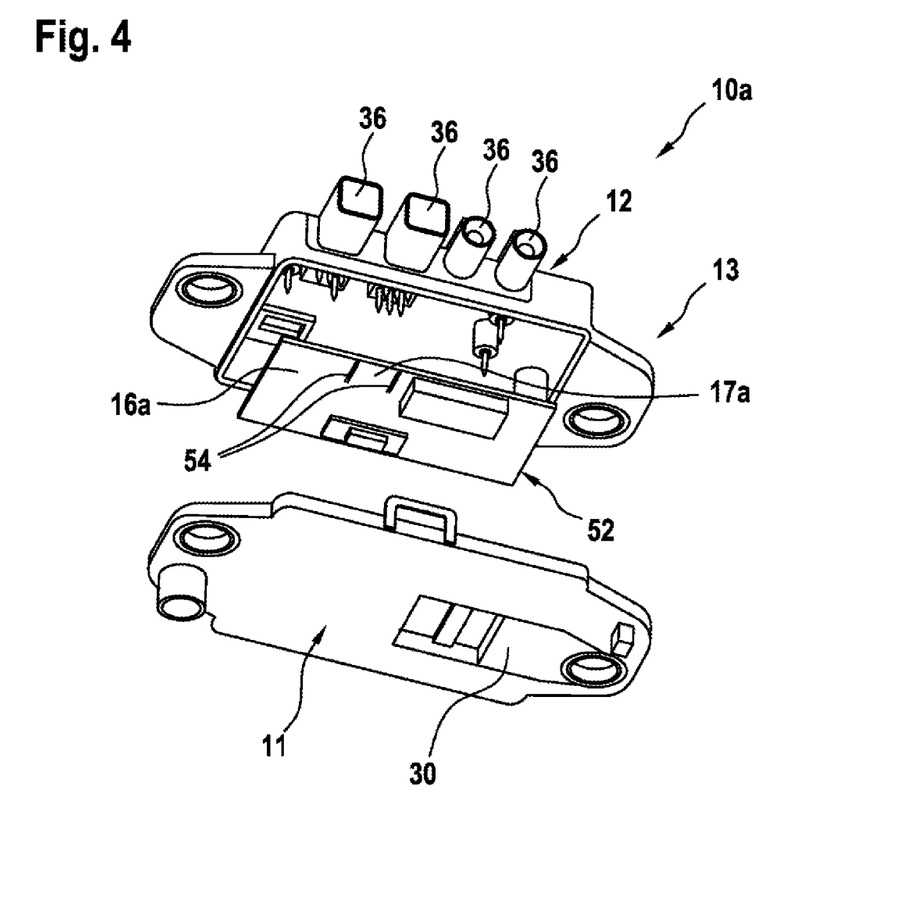
FIG. 4 shows the components of the second control unit in a perspective view from below.

The second control unit 10a illustrated in FIGS. 3 and 4 differs from the control unit 10 in that only a single circuit board 52 is provided, which bears both the at least one heat-generating component 1 and the at least one sensor element 40. The vibration damping between the circuit board 52 and the housing 13 is realized in that the circuit board 52 is mounted by means of at least one element 53 which is arranged on the housing element 11 and which is composed of elastic material such as silicone. It may alternatively or additionally also be provided that, in order to form two circuit carriers 16a, 17a, the circuit board 52 has passage openings, slots 54 or the like in the region of the at least one sensor element 40, as is symbolically illustrated on the basis of FIG. 4, which passage openings, slots or the like separate the region in which the at least one sensor element 40 is arranged on the circuit board 52, in order to form the second circuit carrier 17a, from those regions of the circuit board 52 which form the first circuit carrier 16a with the components 1. The connection between the two circuit carriers 16a, 17a on the circuit board 52 is thus realized only in regions.

Figure 5:
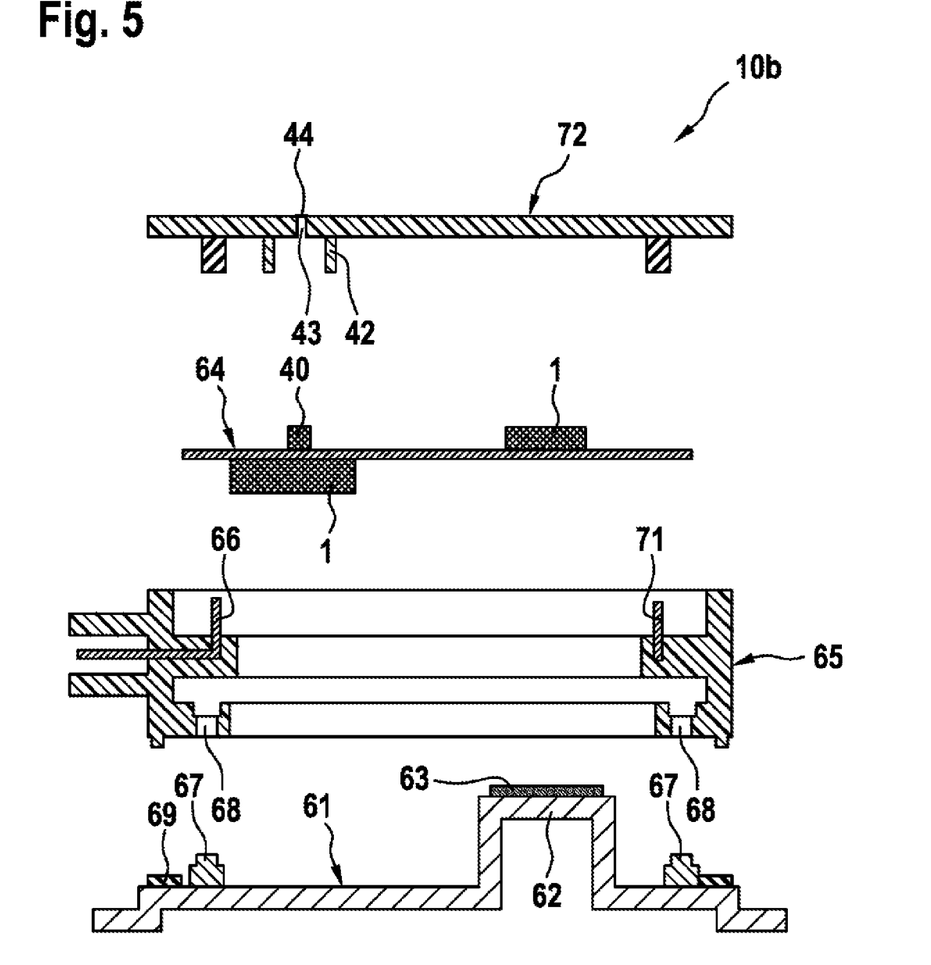
FIG. 5 shows the components of a third control unit in a simplified longitudinal section.
Figure 6:
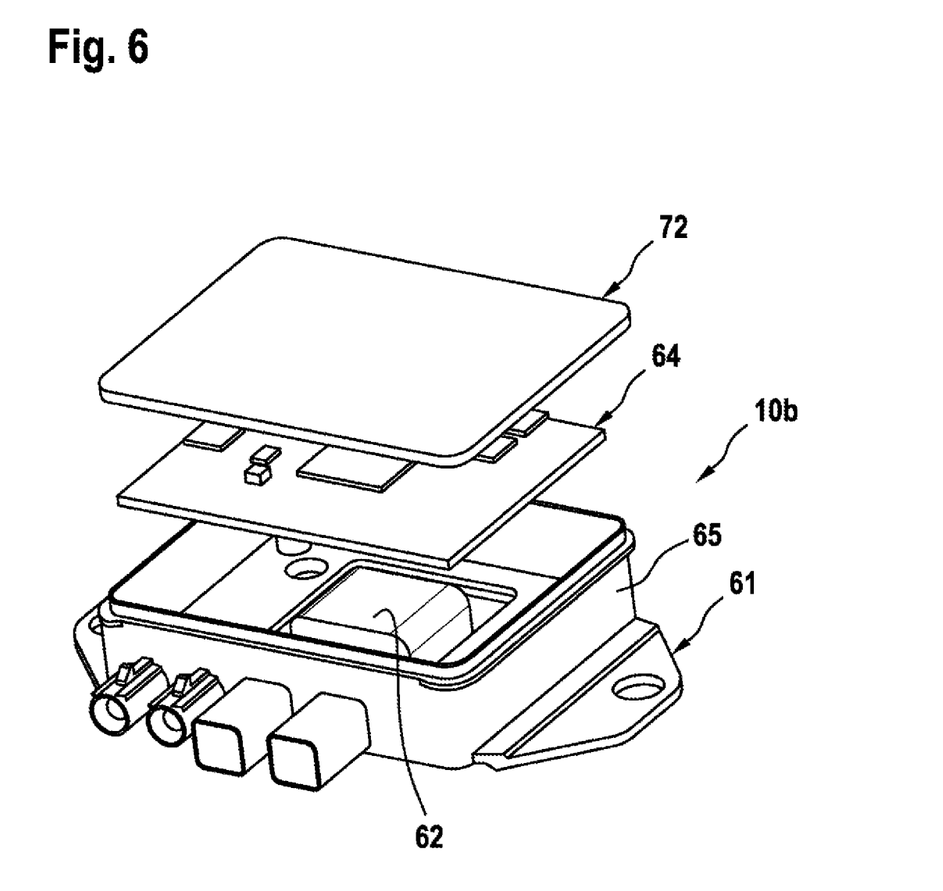
FIG. 6 shows the components of the third control unit in a perspective view from above.

The third control unit 10b illustrated in FIGS. 5 and 6 has a first housing element 61 which is composed of metal, in particular of sheet metal, which is formed in a deep-drawing process, and which is in the form of a housing base. The first housing element 61 has an elevated region 62 which is thermally coupled by means of a heat-conducting adhesive 63 to the underside of a circuit carrier 64 which is formed as a circuit board. The housing element 61 itself therefore acts so as to dissipate heat in the direction of the carrier element 25 (not illustrated). Analogously to the circuit board 52 in the case of the second control unit 10a, both the components 1, of which at least one of the components 1 is formed as a heat-generating component 1, and at least one sensor element 40 are situated on the circuit carrier 64. In the case of the control unit 10b, too, the elevated region 62 or the heat-conducting adhesive 63 is arranged in the region of overlap with the at least one heat-generating component 1.

The first housing element 61 interacts with a frame-like or sleeve-like second housing element 65 which is composed of plastic and in which the connector elements 66 for the electrical (and mechanical) contacting of the circuit carrier 64 are also arranged. The connection between the two housing elements 61, 65 is realized by means of a detent or rivet connection, for which purpose corresponding projections 67, and openings 68 corresponding therewith, are formed on the two housing elements 61, 65. The sealing between the two housing elements 61, 65 is realized by means of a sealing element 69 arranged between the two housing elements 61, 65.

A structural unit produced from the two housing elements 61, 65 can be connected to the circuit carrier 64 by virtue of the circuit carrier 64 being designed to form a press-fit connection with the connector elements 66 and additional connecting elements 71, wherein the circuit carrier 64 is inserted from above into the region of the housing element 65 in the direction of the housing element 61. Furthermore, analogously to the second control unit 10a, it may be provided that, in the region of the at least one sensor element 40, the circuit carrier 64 has measures for vibration damping in the form of corresponding cutouts or slots etc. (not illustrated), which measures reduce a transmission of vibrations via the housing elements 61, 65 to the sensor element 40.

On the side averted from the first housing element 61, the second housing element 65 can be closed off by means of a housing lid which is composed of plastic and which forms a third housing element 72. The connection between the two housing elements 65, 72 is realized, in a manner known per se, by means of an adhesive connection or a (laser-)welded seam, for example, wherein leak-tightness between the housing elements 65, 72 is ensured by means of conventional technologies.

Figure 7:
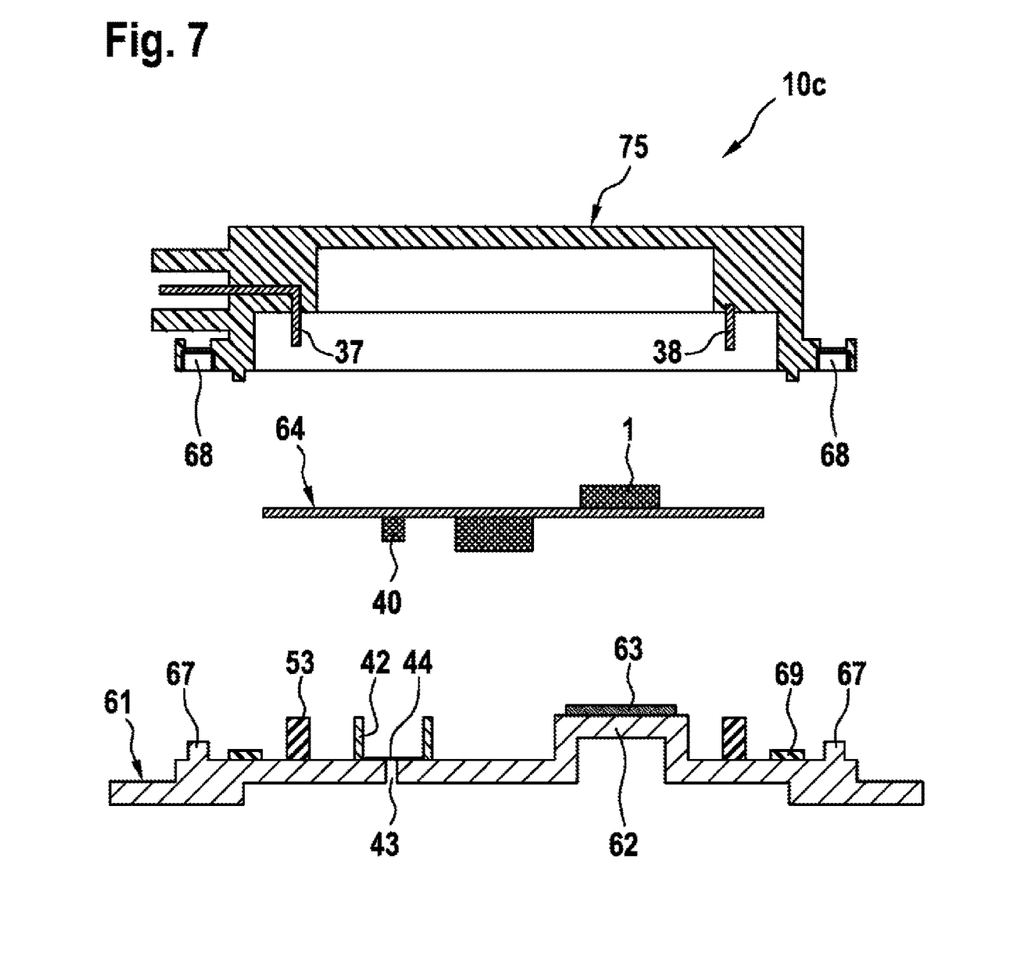
FIG. 7 shows the components of a fourth control unit in a simplified longitudinal section.

The components of the fourth control unit 10c illustrated in FIG. 7 differ from the components of the control unit 10b corresponding to FIGS. 5 and 6 substantially in that the two housing elements 65, 72 are replaced by a unipartite, lid-like or cover-like housing element 75. The housing element 75 is likewise composed of plastic and is produced by injection molding. The fourth control unit 10c is produced by virtue of the circuit carrier 64 being connected to the connector elements 66 and the connecting elements 71, which form a press-fit connection. Subsequently, the assembly composed of the circuit carrier 64 and the housing element 75 is connected to the first housing element 61 composed of metal, which in particular also permits the dissipation of heat from the at least one heat-generating thermal element 1. Furthermore, in the case of the control unit 10c, the at least one sensor element 40 is arranged on that side of the circuit carrier 64 which faces toward the housing element 61, for which purpose a corresponding opening 43 and pressure diaphragm 44 are formed in the housing element 61.

Figure 8:
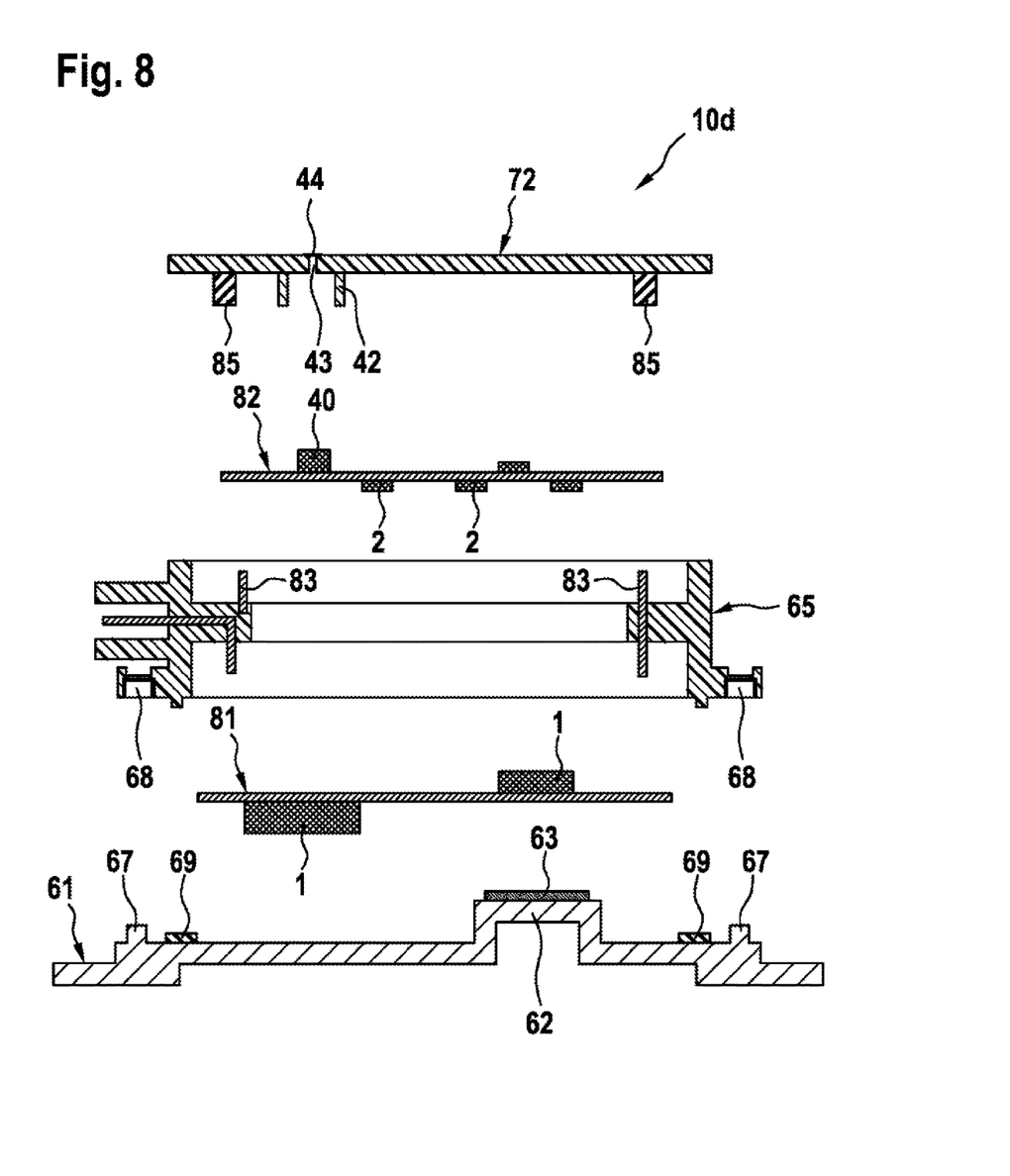
FIG. 8 shows the components of a fifth control unit in a longitudinal section.

Finally, the components of a fifth control unit 10d are illustrated in FIG. 8. The construction of the fifth control unit 10d substantially corresponds to that of the third control unit 10b corresponding to FIGS. 5 and 6. By contrast to the control unit 10b, the control unit 10d has two circuit carriers 81, 82 formed as circuit boards. Whereas the first circuit carrier 81 bears the at least one heat-generating component 1, the second circuit carrier 82 bears the at least one sensor element 40. Furthermore, the second circuit carrier 82 is mechanically connected to the second housing element 65, and also electrically connected to the first circuit carrier 81, by means of pin-like connecting elements 83 which are arranged on the second housing element 65 and which form a press-fit connection. Vibration-damping elements 85, composed for example of silicone, are arranged on the lid-like third housing element 72 on the side facing toward the second circuit carrier 82, which vibration-damping elements dampen vibrations transmitted via the second housing element 65 to the second circuit carrier 82.

The control unit 10, 10a to 10d thus described may be altered or modified in a variety of ways without departing from the concept of the invention.

The invention claimed is:

1. A control unit (10; 10a to 10d), having a housing (13) which is composed of at least two housing elements (11, 12; 61, 65, 72; 75), having at least one circuit carrier (16; 16a; 64; 81) on which at least one heat-generating component (1) is arranged, having a heat-conducting element (30; 61) which is composed of metal and which serves for dissipating the heat generated by the at least one heat-generating component (1), having at least one sensor element (40, 41) which is connected at least indirectly to the at least one circuit carrier (16; 16a;
64; 81), and having at least one plug connector body (35) which is composed of plastic and which has connector elements (36) for the electrical contacting of the at least one circuit carrier (16; 16a; 64; 81), wherein a first one of the housing elements (12; 65; 75) is frame-like or lid-like and is composed of plastic, and wherein the plug connector body (35) is, in the region of said first one of the housing elements, formed integrally with said first one of the housing elements or formed as a component separate from said first one of the housing elements (12; 65; 75), wherein the heat-conducting element (30) is arranged as an insert part in a second one of the housing elements (11) composed substantially of plastic, and the heat-conducting element (30) is thermally connectable to a carrier element (25) for the housing (13), and wherein the second one of the housing elements has a projection into the interior space of the housing, the projection having a heat conductive adhesive thermally coupled with the heat-generating component (1).

2. The control unit as claimed in claim 1, characterized in that the at least one heat-generating component (1) and the at least one sensor element (40, 41) are arranged on different circuit carriers (16; 16a, 17; 17a; 64; 81, 82), wherein the circuit carrier (17; 17a) for the at least one sensor element (40, 41) is arranged in vibration-damped fashion.

3. The control unit as claimed in claim 2, characterized in that the circuit carrier (17; 82) which bears the at least one sensor element (40, 41) is electrically connected, exclusively to the circuit carrier (16; 81) which bears the at least one heat-generating component (1).

4. The control unit as claimed in claim 2, characterized in that the circuit carrier (82) which bears the at least one sensor element (40, 41) is mechanically coupled to the circuit carrier (81) which bears the at least one heat-generating component (1) by connecting elements (83) arranged in a housing element (65).

5. The control unit as claimed in claim 2, characterized in that the circuit carrier (17; 82) which bears the at least one sensor element (40, 41) is electrically connected, by a mechanically floating connection (46), exclusively to the circuit carrier (16; 81) which bears the at least one heat-generating component (1).

6. The control unit as claimed in claim 1, characterized in that contacting between the connector elements (36) and the at least one circuit carrier (16; 16a; 64;
81) is formed by means of press-fit connections.

7. The control unit as claimed in claim 1, characterized in that at least one of the connector elements (36) is formed as a high-frequency connector.

8. The control unit as claimed in claim 1, wherein the heat conducting adhesive (31) is between the projection and the at least one circuit carrier (16).

9. A control unit (10; 10a to 10d), having a housing (13) which is composed of at least two housing elements (11, 12; 61, 65, 72; 75), having at least one circuit carrier (16; 16a; 64; 81) on which at least one heat-generating component (1) is arranged, having a heat-conducting element (30; 61) which is composed of metal and which serves for dissipating the heat generated by the at least one heat-generating component (1), having at least one sensor element (40, 41) which is connected at least indirectly to the at least one circuit carrier (16; 16a;
64; 81), and having at least one plug connector body (35) which is composed of plastic and which has connector elements (36) for the electrical contacting of the at least one circuit carrier (16; 16a; 64; 81), wherein a first one of the housing elements (12; 65; 75) is frame-like or lid-like and is composed of plastic, and wherein the plug connector body (35) is, in the region of said first one of the housing elements, formed integrally with said first one of the housing elements or formed as a component separate from said first one of the housing elements (12; 65; 75), and wherein a second one of the housing elements has a first surface and a second surface, wherein the second surface is formed by a projection extending from the first surface into the interior space of the housing, the first surface having a larger surface area than the second surface, the second surface of the projection having a heat conductive adhesive thermally coupled with the heat-generating component (1).

10. The control unit as claimed in claim 9, characterized in that the second one of the housing elements (61) is composed substantially of metal.

11. A control unit (10; 10a to 10d), having a housing (13) which is composed of at least two housing elements (11, 12; 61, 65, 72; 75), having at least one circuit carrier (16; 16a; 64; 81) on which at least one heat-generating component (1) is arranged, having a heat-conducting element (30; 61) which is composed of metal and which serves for dissipating the heat generated by the at least one heat-generating component (1), having at least one sensor element (40, 41) which is connected at least indirectly to the at least one circuit carrier (16; 16a;

64; 81), and having at least one plug connector body (35) which is composed of plastic and which has connector elements (36) for the electrical contacting of the at least one circuit carrier (16; 16a; 64; 81), wherein a first one of the housing elements (12; 65; 75) is frame-like or lid-like and is composed of plastic, and wherein the plug connector body (35) is, in the region of said first one of the housing elements, formed integrally with said first one of the housing elements or formed as a component separate from said first one of the housing elements (12; 65; 75), wherein the heat-conducting element is formed by a second one of the housing elements (61) composed substantially of metal, and wherein a second one of the housing elements has a projection into the interior space of the housing, the projection having a heat conductive adhesive thermally coupled with the heat-generating component (1), wherein the at least one heat-generating component (1) and the at least one sensor element (40, 41) are arranged on different circuit carriers (16; 16a, 17; 17a; 64; 81, 82), wherein the circuit carrier (17; 17a) for the at least one sensor element (40, 41) is arranged in vibration-damped fashion.

12. The control unit as claimed in claim 11, characterized in that the circuit carrier (17; 82) which bears the at least one sensor element (40, 41) is electrically connected, exclusively to the circuit carrier (16; 81) which bears the at least one heat-generating component (1).

13. The control unit as claimed in claim 11, characterized in that the circuit carrier (82) which bears the at least one sensor element (40, 41) is mechanically coupled to the circuit carrier (81) which bears the at least one heat-generating component (1) by connecting elements (83) arranged in a housing element (65).

14. The control unit as claimed in claim 11, characterized in that the circuit carrier (17; 82) which bears the at least one sensor element (40, 41) is electrically connected, by a mechanically floating connection (46), exclusively to the circuit carrier (16; 81) which bears the at least one heat-generating component (1).

15. The control unit as claimed in claim 11, characterized in that the second one of the housing elements (61) is formed as a deep-drawn part, and in that the second one of the housing elements (61) has, in a region of overlap with the at least one heat-generating component (1), a deformed region (62) forming the projection.

16. The control unit as claimed in claim 11, characterized in that the first one of the housing elements (65) is closed off by a third one of the housing elements (72) which is composed of plastic and which forms a housing lid.

17. The control unit as claimed in claim 11, characterized in that contacting between the connector elements (36) and the at least one circuit carrier (16; 16a; 64; 81) is formed by means of press-fit connections.

18. The control unit as claimed in claim 11, characterized in that at least one of the connector elements (36) is formed as a high-frequency connector.

19. The control unit as claimed in claim 11, characterized in that the second one of the housing elements (61) is a housing base.

20. The control unit as claimed in claim 11, wherein the heat conducting adhesive (31) is between the projection and the carrier (16).

21. A control unit (10; 10a to 10d), having a housing (13) which is composed of at least two housing elements (11, 12; 61, 65, 72; 75), having at least one circuit carrier (16; 16a; 64; 81) on which at least one heat-generating component (1) is arranged, having a heat-conducting element (30; 61) which is composed of metal and which serves for dissipating the heat generated by the at least one heat-generating component (1), having at least one sensor element (40, 41) which is connected at least indirectly to the at least one circuit carrier (16; 16a;

64; 81), and having at least one plug connector body (35) which is composed of plastic and which has connector elements (36) for the electrical contacting of the at least one circuit carrier (16; 16a; 64; 81), wherein a first one of the housing elements (12; 65; 75) is frame-like or lid-like and is composed of plastic, and wherein the plug connector body (35) is, in the region of said first one of the housing elements, formed integrally with said first one of the housing elements or formed as a component separate from said first one of the housing elements (12; 65; 75), and wherein a second one of the housing elements has a projection into the interior space of the housing, the projection extending farther into the interior space of the housing than the remainder of the second one of the housing elements, wherein the projection has a heat conductive adhesive thermally coupled with the heat-generating component (1).

* * * * *